US 11,631,596 B2

(12) United States Patent
Shimizu et al.

(10) Patent No.: US 11,631,596 B2
(45) Date of Patent: Apr. 18, 2023

(54) CONCENTRATION CONTROL APPARATUS, SOURCE CONSUMPTION QUANTITY ESTIMATION METHOD, AND PROGRAM RECORDING MEDIUM ON WHICH A PROGRAM FOR A CONCENTRATION CONTROL APPARATUS IS RECORDED

(71) Applicant: HORIBA STEC, Co., Ltd., Kyoto (JP)

(72) Inventors: Toru Shimizu, Kyoto (JP); Masakazu Minami, Kyoto (JP)

(73) Assignee: HORIBA STEC, CO., LTD., Kyoto (JP)

( * ) Notice: Subject to any disclaimer, the term of this patent is extended or adjusted under 35 U.S.C. 154(b) by 387 days.

(21) Appl. No.: 16/807,722

(22) Filed: Mar. 3, 2020

(65) Prior Publication Data

US 2020/0294820 A1    Sep. 17, 2020

(30) Foreign Application Priority Data

Mar. 12, 2019    (JP) .............................. JP2019-044473

(51) Int. Cl.
C23C 16/448    (2006.01)
H01L 21/67    (2006.01)
G05D 11/13    (2006.01)

(52) U.S. Cl.
CPC .... H01L 21/67023 (2013.01); C23C 16/4482 (2013.01); G05D 11/139 (2013.01)

(58) Field of Classification Search
CPC .......... H01L 21/67023; C23C 16/4482; G05D 11/139
See application file for complete search history.

(56) References Cited

U.S. PATENT DOCUMENTS 6,772,072 B2 *   8/2004   Ganguli .............. C23C 16/4481
                                               427/248.1
8,459,290 B2 *   6/2013   Minami ............... G05D 11/132
                                               261/65
(Continued)

FOREIGN PATENT DOCUMENTS

JP    04-357193    12/1992
JP    2010-109302    5/2010
(Continued)

OTHER PUBLICATIONS

Official Communication received in Japan Patent Application No. 2019-044473, dated Jan. 31, 2023.

*Primary Examiner* — Kevin F Murphy
(74) *Attorney, Agent, or Firm* — Greenblum & Bernstein, P.L.C.

(57) ABSTRACT

In order to provide a concentration control apparatus that, without adding any new sensors or the like, makes it possible to accurately estimate a quantity of source consumed inside a vaporization tank, and to perform highly accurate concentration control in accordance with the remaining quantity of source, there is provided a concentration control apparatus that, in a vaporizer that is equipped with at least a vaporization tank containing a liquid or solid source, a carrier gas supply path that supplies a carrier gas to the vaporization tank, and a source gas extraction path along which flows a source gas which is created by vaporizing the source and is then extracted from the vaporization tank, controls a concentration of the source gas and includes a concentration monitor that is provided on the source gas extraction path, and outputs output signals in accordance with a concentration of the source gas.

9 Claims, 4 Drawing Sheets

(56) References Cited

U.S. PATENT DOCUMENTS

| | | | |
|---|---|---|---|
| 8,571,817 B2* | 10/2013 | Bour | C23C 16/52 |
| | | | 702/140 |
| 9,631,777 B2* | 4/2017 | Nagase | F17D 3/00 |
| 2017/0101715 A1* | 4/2017 | Nishizato | G01N 21/84 |

FOREIGN PATENT DOCUMENTS

| | | |
|---|---|---|
| JP | 2010-278167 | 12/2010 |
| JP | 2017-101295 | 6/2017 |

* cited by examiner

CONCENTRATION CONTROL APPARATUS, SOURCE CONSUMPTION QUANTITY ESTIMATION METHOD, AND PROGRAM RECORDING MEDIUM ON WHICH A PROGRAM FOR A CONCENTRATION CONTROL APPARATUS IS RECORDED

TECHNICAL FIELD

The present invention relates to a concentration control apparatus that controls a concentration of a source gas that is created by vaporizing a source contained in a vaporization tank using a carrier gas, and is then extracted together with the carrier gas.

TECHNICAL BACKGROUND

In a semiconductor manufacturing process, a carrier gas is introduced, for example, into a liquid source that is contained in a vaporization tank, and the source gas that is vaporized via bubbling is then supplied to a film formation chamber or the like (see Patent Document 1).

A concentration control apparatus is used in order to maintain the concentration of this type of source gas at a predetermined concentration. This concentration control apparatus is provided with a concentration measuring mechanism that measures a concentration of a source gas and is provided on a source gas extraction path that connects a vaporization tank to a chamber, a first mass flow controller that controls a flow rate of a carrier gas that is introduced into the vaporization tank, a second mass flow controller that controls a flow rate of a dilution gas that is supplied to a source gas supply path, and a control mechanism that controls the respective mass flow controllers. The control mechanism performs concentration feedback control on set flow rates that are set in each mass flow controller in order to reduce a deviation between a set concentration that is set by a user and a measurement concentration that is measured by the concentration measuring mechanism.

However, as the vaporization of the source inside the vaporization tank advances and the remaining quantity of source decreases, changes sometimes occur in the characteristics of the concentration feedback control system. As a result, in spite of the same control continuing unchanged, there have been cases when the desired concentration control could not be achieved.

DOCUMENTS OF THE PRIOR ART

Patent Documents

[Patent document 1] Japanese Unexamined Patent Application (JP-A) No. 2010-278167

DISCLOSURE OF THE INVENTION

Problems to be Solved by the Invention

The present invention was therefore conceived in order to solve the above-described problems, and it is an object thereof to provide a concentration control apparatus that, without adding any new sensors or the like, makes it possible to accurately estimate a quantity of source consumed inside a vaporization tank, and to perform highly accurate concentration control in accordance with the remaining quantity of source.

Means for Solving the Problem

Namely, a concentration control apparatus according to the present invention is a concentration control apparatus that, in a vaporizer that is equipped with at least a vaporization tank containing a liquid or solid source, a carrier gas supply path that supplies a carrier gas to the vaporization tank, and a source gas extraction path along which flows a source gas which is created by vaporizing the source and is then extracted from the vaporization tank, controls a concentration of the source gas and that includes a concentration monitor that is provided on the source gas extraction path, and outputs output signals in accordance with a concentration of the source gas, a concentration calculation unit that, based on the output signals from the concentration monitor, calculates the concentration of the source gas, and a source consumption quantity calculator that, based on the calculated concentration calculated by the concentration calculation unit and on a flow rate of the carrier gas, calculates a consumption quantity of the source which has been extracted to the source gas extraction path as source gas.

Here, the flow rate of the carrier gas is a value measured by a flow rate sensor, and is a set value that is set in a flow rate control device such as a mass flow rate controller or the like.

If this type of structure is employed, then it is possible, without having to separately provide sensors that detect consumption quantities and remaining quantities of a source, to estimate a consumption quantity of a source based on an output from a concentration monitor, which is essential structure for performing concentration control. Moreover, because the calculated concentration is obtained in each control cycle in which concentration control is performed, it is possible to ascertain a consumption quantity of a source substantially in real time, and to accurately ascertain the state of a concentration control system at that particular point in time. As a result, for example, optimal control parameters can be set automatically in accordance with the state of a concentration control system, and it is possible to consistently achieve concentration control having a uniform accuracy irrespective of the remaining quantity of a source.

It is also possible for the vaporizer to further include a dilution gas supply path that merges with the source gas extraction path and supplies dilution gas to the source gas extraction path. When concentration control is performed by diluting the source gas, then, in order to accurately estimate a consumption quantity of the source, it is also possible for the source consumption quantity calculator to calculate the consumption quantity of the source based on the calculated concentration and on a total carrier flow rate, which is a sum of the flow rate of the carrier gas and a flow rate of the dilution gas.

An example of a specific structure that is used to calculate a consumption quantity of the source is a concentration control apparatus in which the source consumption quantity calculator includes a source flow rate calculation unit that calculates the flow rate of the source gas at particular timings from the calculated concentration and the total carrier flow rate at the particular timings, and a consumption quantity calculation unit that calculates the consumption quantity of the source based on the flow rate of the source gas at the particular timings, and on a source gas supply time which is the length of time that the source gas is supplied to the source gas extraction path.

In order to enable results of concentration control performed up until a particular point to be reflected in the calculation values of the consumption quantity of the source at that time, and so as to thereby enable a control state to be ascertained more accurately, it is also possible for there to be further provided a first mass flow controller that is provided on the carrier gas supply path and controls the flow rate of the carrier gas flowing through the carrier gas supply path such that this flow rate reaches a first set flow rate, and a second mass flow controller that is provided on the dilution gas supply path and controls the flow rate of the dilution gas flowing through the dilution gas supply path such that this flow rate reaches a second set flow rate, and for the source flow rate calculation unit to calculate the total carrier flow rate from the first set flow rate or the flow rate of the carrier gas measured by the first mass flow controller, and the second set flow rate or the flow rate of the dilution gas measured by the second mass flow controller.

In order to enable feedback control characteristics to be altered such that a uniform accuracy can be consistently achieved even when the state of the concentration control system changes due to a change in the remaining quantity of the source, it is also possible for there to be further provided a concentration control unit that controls the concentration of the source gas by altering the first set flow rate and the second set flow rate that are set respectively in the first mass flow controller and the second mass flow controller based on a deviation between a set concentration that has been previously set and the calculated concentration, and on control parameters that are set, and for the control parameters to be altered in accordance with the consumption quantity of the source that is calculated by the source consumption quantity calculator, or in accordance with the remaining quantity of the source inside the vaporization tank.

In order to enable a consumption quantity of a source to be accurately estimated when concentration control is performed without using dilution gas, it is also possible for the source consumption quantity calculator to include a source flow rate calculation unit that calculates the flow rate of the source gas at particular timings from the calculated concentration and the flow rate of the carrier gas at the particular timings, and a consumption quantity calculation unit that calculates the consumption quantity of the source based on the flow rate of the source gas at the particular timings, and on a source gas supply time which is the length of time that the source gas is supplied to the source gas supply path.

In order to also make it possible to accurately ascertain the remaining quantity of the source inside a vaporization tank when control of the concentration of the source gas is being achieved via pressure control, it is also possible for there to be further provided a first mass flow controller that is provided on the carrier gas supply path and controls the flow rate of the carrier gas flowing through the carrier gas supply path such that this flow rate reaches a first set flow rate, and a pressure control valve that is provided on the source gas extraction path, and for the source consumption quantity calculator to calculate the consumption quantity of the source based on the first set flow rate or the flow rate of the carrier gas measured by the first mass flow controller.

When the concentration of the source gas is controlled via the pressure control valve, then an example of a specific structure that enables control characteristics to be altered in accordance with the remaining quantity of the source is a concentration control apparatus in which there is further provided a concentration control unit that controls the concentration of the source gas by controlling at least an aperture of the pressure control valve based on a deviation between a set concentration, which has been set in advance, and the calculated concentration, and on set control parameters, and the control parameters are altered in accordance with the consumption quantity of the source calculated by the source consumption quantity calculator, or with the remaining quantity of the source inside the vaporization tank.

An example of a specific embodiment that is used to achieve concentration control that corresponds to changes in control characteristics that are caused by the quantity of source that has been consumed is a concentration control apparatus in which there are further provided a control parameter storage unit that stores a plurality of control parameters corresponding to the consumption quantity of the source or to the remaining quantity of the source, and a control parameter setting unit that refers to the control parameter storage unit in accordance with the consumption quantity of the source calculated by the source consumption quantity calculator, or with the remaining quantity of the source, and sets corresponding control parameters in the concentration control unit.

An example of a source consumption quantity estimation method that is used to accurately estimate a consumption quantity of a source based on outputs from sensors used to control the concentration of a source gas, and does not require separate sensors to be additionally provided is a source consumption quantity estimation method that, in a vaporizer that is equipped with at least a vaporization tank containing a liquid or solid source, a carrier gas supply path that supplies a carrier gas to the vaporization tank, and a source gas extraction path along which flows a source gas which is created by vaporizing the source and is then extracted from the vaporization tank, is used to estimate a consumption quantity of the source and includes a concentration calculation step that calculates a concentration of the source gas based on output signals from a concentration monitor that is provided on the source gas extraction path, and a source consumption quantity calculation step in which, based on the calculated concentration and on a flow rate of the carrier gas, a consumption quantity of the source which has been extracted to the source gas extraction path as the source gas is calculated.

In order to provide an existing concentration control apparatus with a function of estimating a consumption quantity of a source, it is also possible to employ a program for a concentration control apparatus that, in a vaporizer that is equipped with at least a vaporization tank containing a liquid or solid source, a carrier gas supply path that supplies a carrier gas to the vaporization tank, and a source gas extraction path along which flows a source gas which is created by vaporizing the source and is then extracted from the vaporization tank, is equipped with a concentration monitor which is provided on the source gas extraction path and outputs output signals in accordance with a concentration of the source gas, and controls a concentration of the source gas, wherein the program causes a computer to perform functions of a concentration calculation unit that, based on the output signals from the concentration monitor, calculates the concentration of the source gas, and a source consumption quantity calculator that, based on the calculated concentration calculated by the concentration calculation unit and on a flow rate of the carrier gas, calculates a consumption quantity of the source which has been extracted to the source gas extraction path as source gas.

Note that the program for a concentration control apparatus may be distributed electronically, or may be recorded on a program recording medium such as a CD, DVD, or flash memory or the like.

Effects of the Invention

According to the concentration control apparatus according to the present embodiment which has the above-described structure, it is possible to accurately estimate the consumption quantity and the remaining quantity of the source inside the vaporization tank based on outputs from a concentration monitor, without having to provide separate sensors other than those already used for concentration control. As a result, because it is possible to accurately ascertain the remaining quantity of the source, it is possible to alter control parameters and the like in accordance with changes in the control state, and to thereby achieve concentration control having a consistently uniform level of accuracy.

BEST EMBODIMENTS FOR IMPLEMENTING THE INVENTION

A concentration control system 200 according to a first embodiment of the present invention will now be described based on the drawings.

The concentration control system 200 according to the present invention is used, for example, to supply a predetermined concentration of gas to a chamber CH that is incorporated into a semiconductor manufacturing line or the like and is used in a semiconductor manufacturing process.

Figure 1:
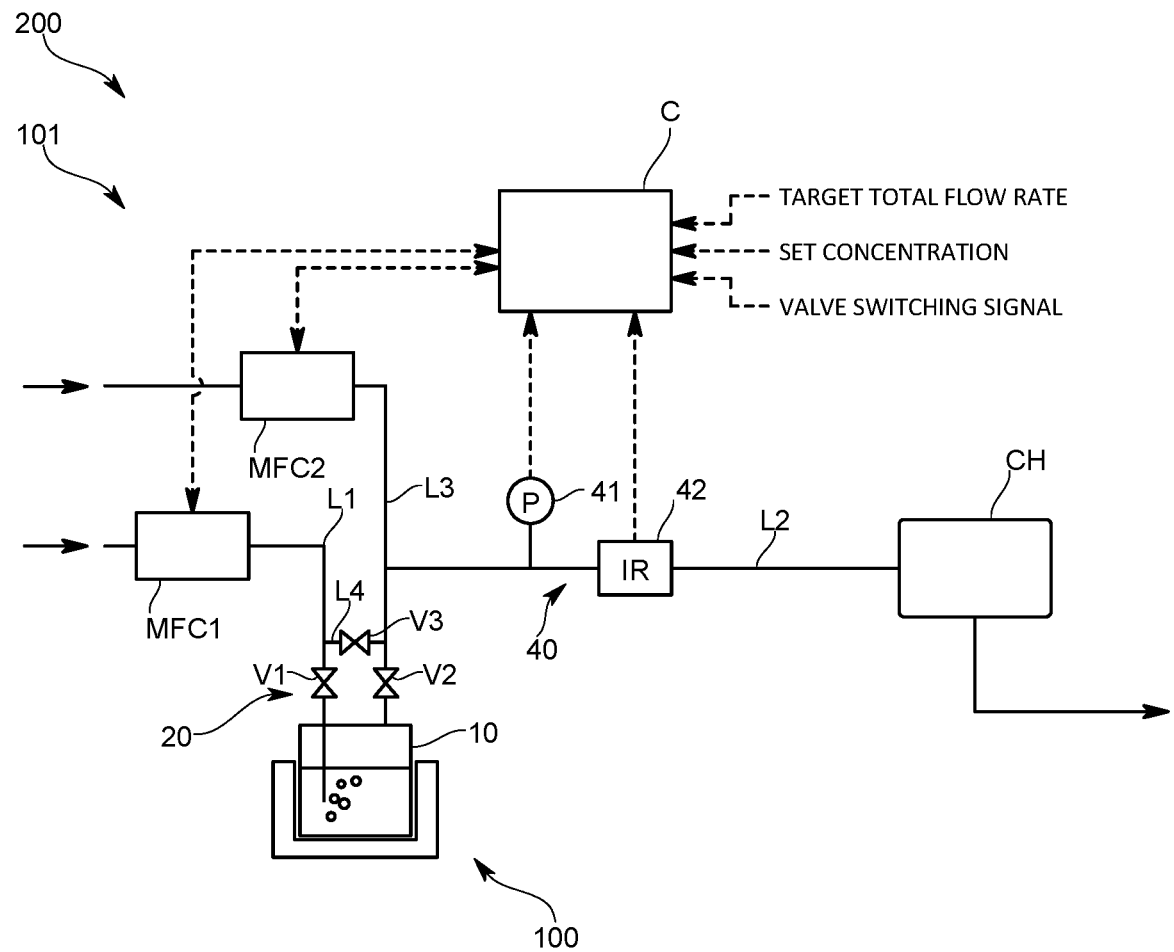
FIG. 1 is a schematic view showing a concentration control system according to a first embodiment of the present invention.

The concentration control system 200 according to the present embodiment is what is known as a 'dilution type (i.e., flow rate type)' of system. As is shown in FIG. 1, the concentration control system 200 is formed by a vaporizer 100, and a concentration control apparatus 101. At least a portion of the instruments of the concentration control apparatus 101 are mounted on the vaporizer 100.

The vaporizer 100 is provided with a vaporization tank 10 that holds a liquid or a solid material, a carrier gas supply path L1 that supplies carrier gas to the vaporization tank 10, a source gas extraction path L2 through which a source gas which is obtained by vaporizing the material is extracted from the vaporization tank 10, a dilution gas supply path L3 that supplies a dilution gas which dilutes the source gas to the source gas extraction path L2, and a switching mechanism 20 that is used to switch between supplying the source gas to the chamber CH and stopping the supply of this source gas.

The switching mechanism 20 has a plurality of valves V1 through V3 that open and close as a result of receiving a valve switching signal output from a control mechanism C of the concentration control apparatus 101 (described below). If a user opens and closes the valves V1 through V3 of the switching mechanism 20 at preset timings, then the supply of carrier gas to the vaporization tank 10 and the stopping of this supply can be performed alternatingly. As a result, source gas is intermittently extracted from the vaporization tank 10 and is intermittently supplied to the chamber CH. In other words, in the concentration control system 200 of the present embodiment, a structure is employed in which a supply period during which a source gas (more specifically, a mixture gas) is supplied to the chamber CH alternates repeatedly with a non-supply period during which this supply of the source gas is stopped.

More specifically, the switching device 20 is provided with a detour flow path L4 that connects the carrier gas supply path L1 and the source gas extraction path L2 together, the first valve V1 that is provided on the carrier gas supply path L1 on the downstream side from a location where the carrier gas supply path L1 is connected to the detour flow path L4, the second valve V2 that is provided on the source gas extraction path L2 on the upstream side from a location where the source gas extraction path L2 is connected to the detour flow path L4, and the third valve V3 that is provided on the detour flow path L4.

More specifically, the supply period in which source gas is supplied to the chamber CH is put into operation by opening the first valve V1 and the second valve V2 of the switching mechanism 20 and closing the third valve V3 thereof, and the non-supply period in which source gas is not supplied to the chamber CH is put into operation by closing the first valve V1 and the second valve V2 of the switching mechanism 20 and opening the third valve V3 thereof.

The concentration control mechanism 101 is provided with a first mass flow controller MFC1 that is provided on the carrier gas supply path L1, a concentration monitor 40 that is provided on the source gas extraction path L2, a second mass flow controller MFC2 that is provided on the dilution gas supply path L3, and the control mechanism C that controls the respective mass flow controllers MFC1 and MFC2 based on outputs from the concentration monitor 40, and thereby controls the concentration of the source gas.

The first mass flow controller MFC1 controls the flow rate of the carrier gas flowing through the carrier gas supply path L1. The first mass flow controller MFC1 is equipped, for example, with a pressure-type flow rate sensor, a flow rate adjustment valve such as a piezo valve or the like, and a control circuit that is equipped with a CPU and memory and the like (each of these components has been omitted from the drawings). The first mass flow controller MFC1 performs feedback control on an aperture of the flow rate adjustment valve such that a deviation between a first set flow rate which is set by the control mechanism C, and a flow rate of the carrier gas as measured by a flow rate sensor is reduced.

The concentration monitor 40 is provided on the source gas extraction path L2 on the downstream side from a merging point where the source gas extraction path L2 merges with the dilution gas supply path L3. The concentration monitor 40 outputs a signal in accordance with the concentration of a source gas that is contained in a mixture gas created from the source gas, the carrier gas, and the dilution gas. In other words, the concentration monitor 40 of the present embodiment utilizes the fact that the concentration (vol %) of the source gas that is contained in the mixture gas is expressed as a ratio of the pressure (i.e., a partial pressure) of the source gas that is contained in the mixture gas relative to the pressure (i.e., the total pressure) of the mixture gas. More specifically, the concentration monitor 40 is provided with a pressure gauge 41 that measures the total pressure of the mixture gas, and a partial pressure gauge 42 that uses, for example, non-dispersive infrared spectroscopy (NDIR) to measure the partial pressure of the source gas.

The second mass flow controller MFC2 controls the flow rate of the dilution gas flowing through the dilution gas supply path L3. In the same way as the first mass flow controller MFC1, the second mass flow controller MFC2 is equipped, for example, with a pressure-type flow rate sensor, a flow rate adjustment valve such as a piezo valve or the like, and a control circuit that is equipped with a CPU and memory and the like (each of these components has been omitted from the drawings). The second mass flow controller MFC2 also performs feedback control on the aperture of the flow rate adjustment valve such that a deviation between a second set flow rate which is set by the control mechanism C, and the flow rate of the carrier gas as measured by the flow rate sensor is reduced.

Figure 2:
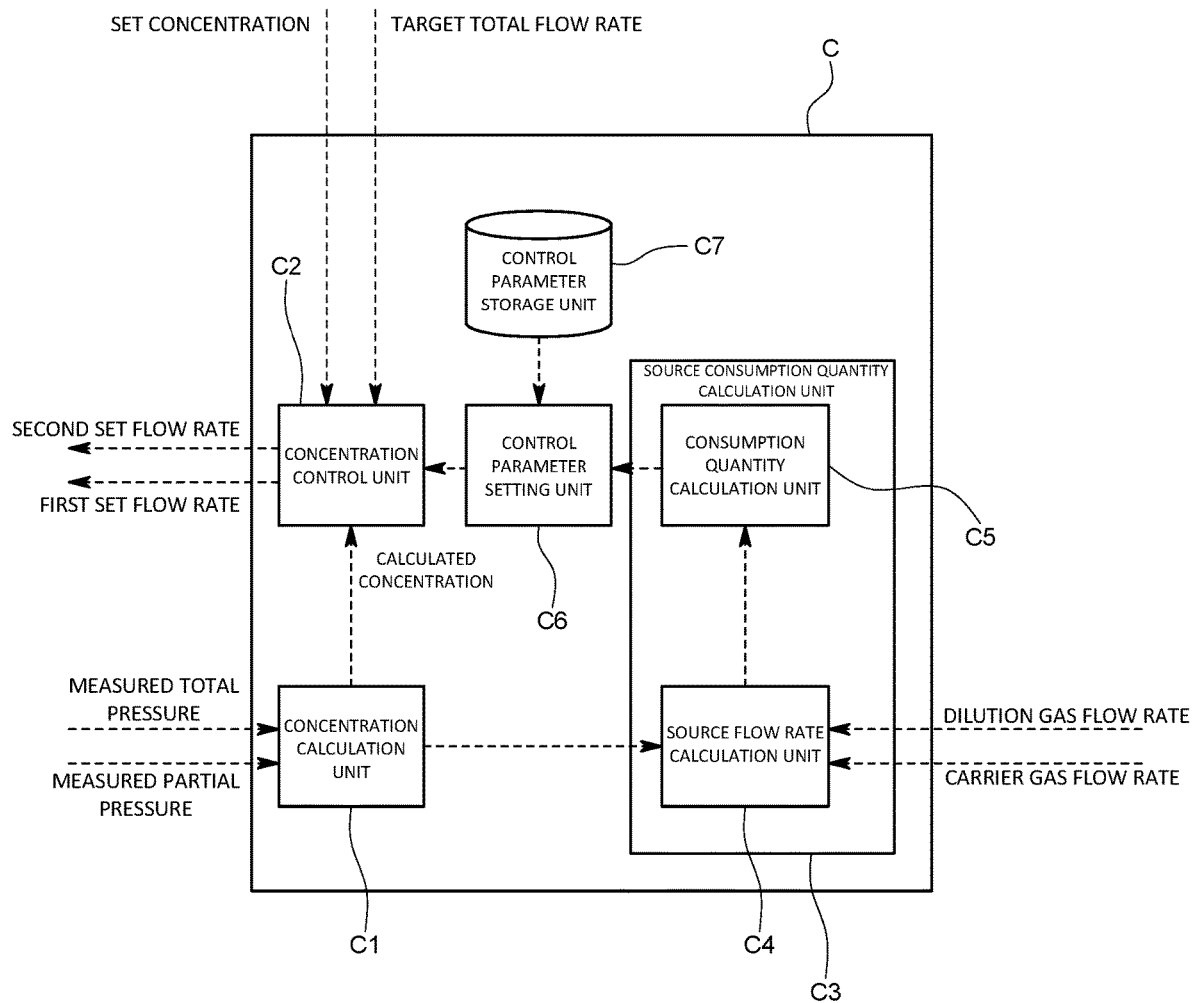
FIG. 2 is a function block diagram of a control mechanism of a concentration control apparatus according the first embodiment.

More specifically, the control mechanism C is a computer having a CPU, memory, A/D and D/A converters, and input and output devices and the like. As is shown in FIG. 2, the control mechanism C is formed such that, as a result of a program stored in the memory being executed by the CPU, the control mechanism C functions at least as a concentration calculation unit C1, a supply control unit (not shown in the drawings), a concentration control unit C2, a source consumption quantity calculator C3, a control parameter setting unit C6, and a control parameter storage unit C7 and the like.

The concentration calculation unit C1 calculates the concentration of the source gas contained in the mixture gas based on output signals output from the concentration monitor 40. More specifically, the concentration calculation unit C1 acquires output signals from both the pressure gauge 41 and the partial pressure gauge 42, and calculates a ratio of a partial pressure detected by the partial pressure gauge 42 relative to a total pressure detected by the pressure gauge 41 as being the concentration (vol %) of the source gas contained in the mixture gas.

The supply control unit receives valve opening/closing signals and determines whether or not a source gas supply period is currently in operation. Based on the result of this determination, the state of the switching mechanism 20 is switched.

During, for example, a source gas supply period, the concentration control unit C2 performs concentration feedback control such that the calculated concentration of the source gas approaches the set concentration by controlling at least one of the first mass flow controller MFC1 or the second mass flow controller MFC2 based on the calculated concentration which was calculated by the concentration calculation unit C1, on the set concentration set by a user, and on the control parameters that have been set. Note that PID control is performed by the concentration control unit C2, and the control parameters correspond, for example, to various types of gain.

More specifically, the set concentration of the material gas contained in the mixture gas which has been set in advance by a user, and a target total flow rate of the gas supplied to the chamber CH are input into the concentration control unit C2. The first set flow rate which is a target flow rate for the carrier gas is successively altered via concentration feedback control which is based on the deviation between this set concentration and the measured concentration. In addition, the second set flow rate which is a target flow rate for the dilution gas is set such that a total quantity of the first set flow rate and this second set flow rate matches the target total flow rate.

The source consumption quantity calculator C3 calculates consumption quantities of a source based on outputs from the various sensors that are used to perform concentration control. In the present embodiment, the source consumption quantity calculator C3 calculates source consumption quantities based on the flow rate of the carrier gas, the flow rate of the dilution gas, and the concentration of the source gas.

More specifically, the source consumption quantity calculator C3 is provided with a source flow rate calculation unit C4 that calculates a flow rate of the source gas flowing through the source gas extraction path L2, and with a consumption quantity calculation unit C5 that calculates the source consumption quantity based on the calculated flow rate of the source gas and on the length of time for which the source gas has been supplied to the source gas extraction path L2.

The source flow rate calculation unit C4 calculates the flow rate of the source gas using the fact that the concentration of source is equal to a value obtained by dividing the flow rate of the source gas flowing through the source gas extraction path L2 by the flow rate of the entire mixture gas. More specifically, the following relational expressions are established.

$$C = Q_V / Q_T \quad (1)$$

$$Q_T = Q_V + Q_C + Q_D \quad (2)$$

Here, $C$ is the concentration (vol. %) of the source gas, $Q_V$ is the flow rate (sccm) of the source gas, $Q_T$ is the flow rate (sccm) of the mixture gas, $Q_C$ is the flow rate (sccm) of the carrier gas, and $Q_D$ is the flow rate (sccm) of the dilution gas.

The following formula is used to determine the flow rate of the source gas $Q_V$ from these Formulae (1) and (2).

$$Q_V = (Q_C + Q_D) / \{C/(1-C)\} \quad (3)$$

In this way, based on the above Formula (3), the source flow rate calculation unit C4 calculates the total carrier flow rate $Q_C + Q_D$, which is the sum of the carrier gas flow rate and the dilution gas flow rate, and the source flow rate $Q_V$ from the calculated concentration $C$. In the present embodiment, values measured by the flow rate sensors of the respective mass flow controllers MFC1 and MFC2 are used for the total carrier flow rate. Note that, instead of the actual measurement values from the flow rate sensors, it is also possible to use, for example, the set flow rates set by the control mechanism C, or to use set flow rates set by a user.

The consumption quantity calculation unit C5 calculates an accumulated source flow rate from a concentration control start point until the current point in time by, for example, multiplying a control cycle Dt by the source gas flow rate $Q_V$ calculated by the source flow rate calculation unit for each control cycle. More specifically, the consumption quantity calculation unit C5 calculates an accumulated source flow rate V using the following Formula (4).

$$V = \Sigma Q_{V_i} D_{t_i} \quad (4)$$

Furthermore, the consumption quantity calculation unit C5 calculates a source consumption quantity m [g] obtained by converting the accumulated source flow rate V [cc] into grams based on the following Formula (5) assuming that the source gas is an ideal gas. Note that M is the molar mass [g/mol] of the source gas molecules.

$$m = VM/(1000 * 22.4) \quad (5)$$

The consumption quantity calculation unit C5 calculates the remaining quantity of source by subtracting the source consumption quantity from the initial quantity of source.

The remaining quantity of source or the consumption quantity of source calculated by the consumption quantity calculation unit C5 is input into the control parameter setting unit C6. The control parameter setting unit C6 then sets appropriate control parameters, for example, sets gains in the concentration control unit C2 in accordance with the remaining quantity of source or the consumption quantity of source calculated by the consumption quantity calculation unit C5. In the present embodiment, the control parameter setting unit C6 refers to a control parameter table in which the source consumption quantity or the source remaining quantity that are stored in the control parameter storage unit C7 are paired with control parameters that correspond to the respective values of the source consumption quantity or the source remaining quantity, and sets control parameters that correspond to the input source consumption quantity or the source remaining quantity in the concentration control unit C2. Note that the control parameter setting unit C6 switches the control parameters discretely in accordance with the source consumption quantity or the source remaining quantity, however, it is also possible for the control parameters to be changed continuously by interpolating the values of stored control parameters.

According to the concentration control apparatus 101 and the concentration control system 200 of the first embodiment which have the above-described structures, it is possible to estimate a source consumption quantity based solely on outputs from flow rate sensors and the concentration monitor 40 which are essential structure for controlling the concentration of a source gas.

Additionally, because the concentration control unit C2 is able to alter the control parameters based on the estimated source consumption quantity, control can be continued at a consistent level of accuracy even when the source decreases, and the characteristics of the concentration control system are changed.

Furthermore, because the values being used are successively updated for each control cycle, it is possible to consistently ascertain accurate source consumption quantities.

Figure 3:
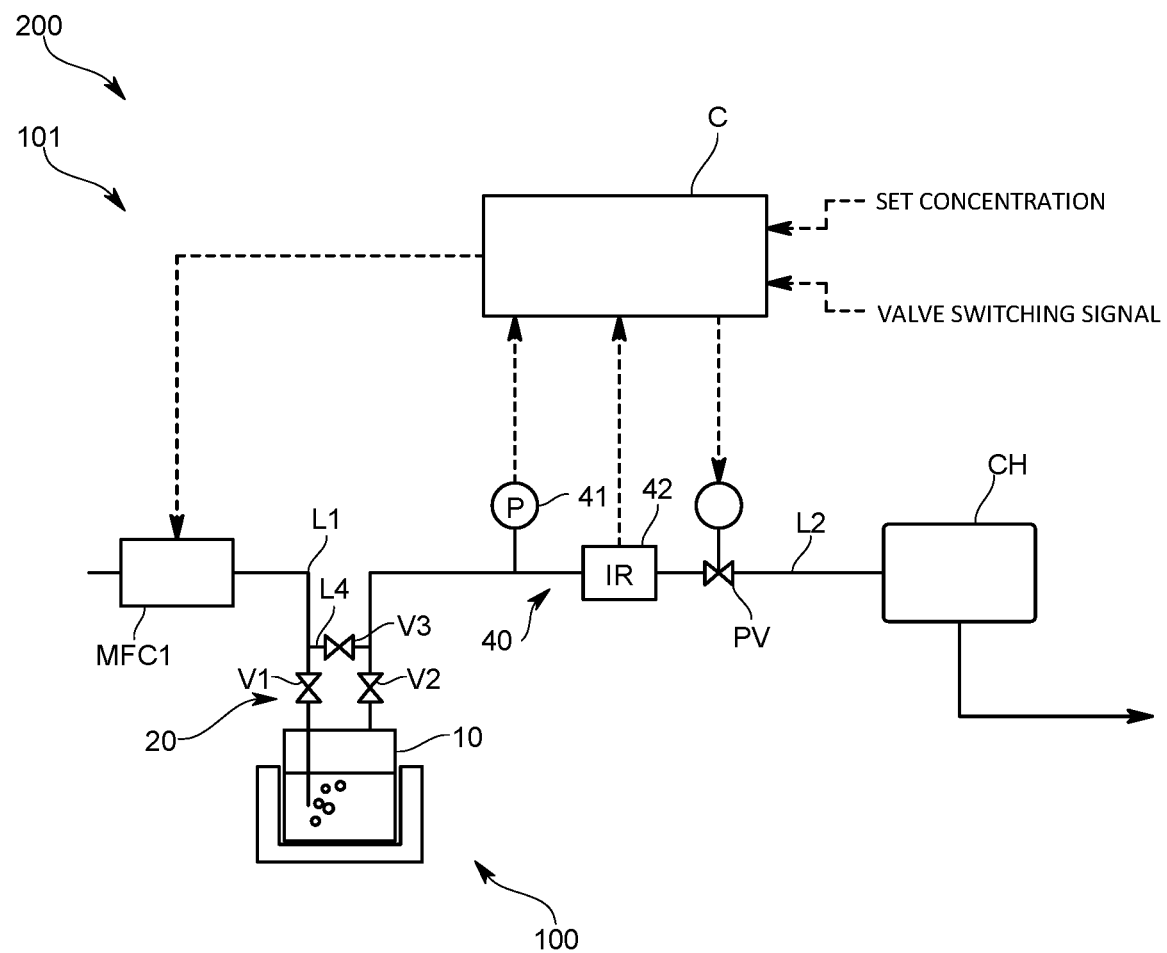
FIG. 3 is a schematic view showing a concentration control system according to a second embodiment of the present invention.
Figure 4:
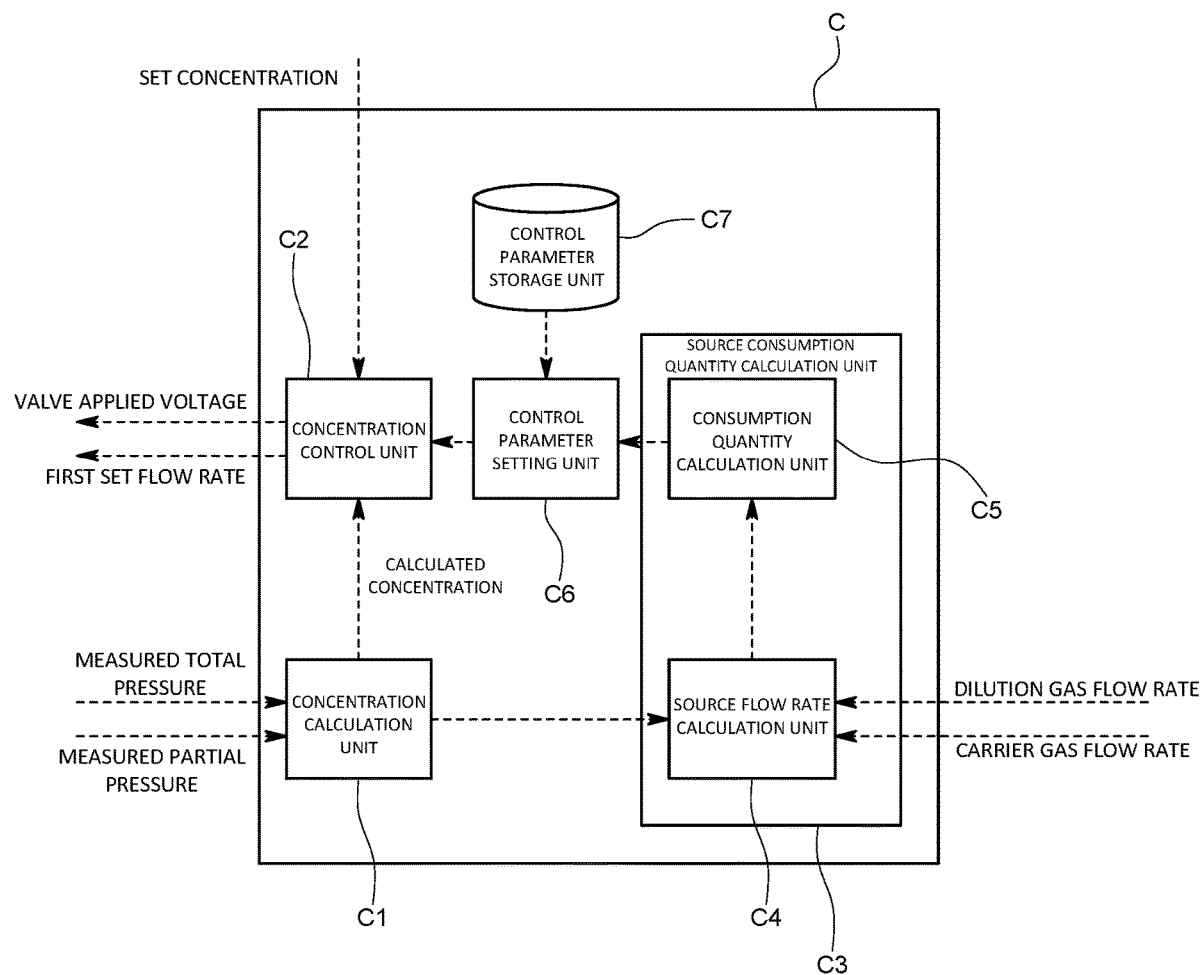
FIG. 4 is a function block diagram of a control mechanism of a concentration control apparatus according the second embodiment.

Next, a concentration control system 200 according to a second embodiment will be described with reference to FIG. 3 and FIG. 4. Note that components corresponding to those already described in the first embodiment are given the same descriptive symbols.

The concentration control system 200 according to the first embodiment is a dilution type (i.e., a flow rate type) of system, however, as is described in the second embodiment, a pressure type of concentration control system 200 may instead be employed. More specifically, as is shown in FIG. 3, the pressure-type concentration control system 200 is not equipped with a dilution gas supply path, but is instead equipped with a pressure control valve PV which is located on a downstream side from the concentration monitor 40 on the source gas extraction path L2.

The subjects of the control performed by the concentration control unit are the first mass flow controller MFC1 which is provided on a carrier gas intake path L1, and the pressure control valve PV. In other words, the concentration control unit C2 performs feedback control on an aperture of the pressure control valve PV based on a deviation between a calculated concentration which has been calculated based on outputs from the concentration monitor 40 and a set concentration. As a result, the concentration of the source gas in a source gas supply path L2 can be held at a set concentration by adjusting the total pressure of the mixture gas.

In addition, in the case of a pressure-type concentration control system, the source consumption quantity calculator C3 calculates a source consumption quantity based on the calculated concentration, and on the carrier gas flow rate measured by the first mass flow controller MFC1. Note that the specific formula in this case is the same as if zero were substituted as the dilution gas flow rate QD in the formula described in the first embodiment.

In this way, in the pressure-type concentration control system 200 of the second embodiment as well, it is also possible to accurately ascertain the quantity of a source remining in the vaporization tank 10 using solely those sensors that are used for concentration control.

Moreover, in the same way as in the first embodiment, because the control parameters set in the concentration control unit C2 are altered in accordance with the remaining quantity of source, it is possible, using pressure-type concentration control as well, to continue concentration control at a substantially consistent level of accuracy irrespective of the remaining quantity of source.

Additional embodiments will now be described.

In the foregoing respective embodiments, a structure is employed in which the consumption quantity and remaining quantity of a source are calculated based on outputs from sensors that are used for concentration control, however, it is also possible to provide separately attachable sensors, and to calculate the consumption quantity and remaining quantity of a source using outputs from these. For example, a weight sensor or a liquid level sensor may be provided in the vaporization tank, and the consumption quantity and remaining quantity of a source may be calculated based on outputs from these.

It is also possible for a separate partial pressure gauge that measures the partial pressure of the source gas, and a concentration sensor that measures the concentration of the source gas to be provided inside a vaporization tank, and for the consumption quantity of the source gas to be calculated based on changes measured by these.

Furthermore, it should be understood that the present invention is not limited to the above-described embodiment, and that various modifications and the like may be made thereto insofar as they do not depart from the spirit or scope of the present invention.

DESCRIPTION OF THE REFERENCE NUMERALS

200 . . . Concentration Control System
100 . . . Vaporizer
101 . . . Concentration control apparatus
40 . . . Concentration Monitor
MFC1 . . . First Mass Flow Controller
MFC2 . . . Second Mass Flow Controller
C1 . . . Concentration Calculation Unit
C2 . . . Concentration Control Unit
C3 . . . Source Consumption Quantity Calculator
C4 . . . Source Flow Rate Calculation Unit
C5 . . . Consumption Quantity Calculation Unit
C6 . . . Control Parameter Setting Unit
C7 . . . Control Parameter Storage Unit

What is claimed is:

1. A concentration control apparatus that, in a vaporizer that is equipped with at least a vaporization tank containing a liquid or solid source, a carrier gas supply path that supplies a carrier gas to the vaporization tank, and a source gas extraction path along which flows a source gas which is created by vaporizing the source and is then extracted from the vaporization tank, controls a concentration of the source gas comprising:

a concentration monitor that is provided on the source gas extraction path, and outputs output signals in accordance with a concentration of the source gas;

a concentration calculation unit that, based on the output signals from the concentration monitor, calculates the concentration of the source gas;

a first mass flow controller that is provided on the carrier gas supply path and controls the flow rate of the carrier gas flowing through the carrier gas supply path such that this flow rate reaches a first set flow rate;

a second mass flow controller that is provided on a dilution gas supply path that merges with the source gas extraction path and supplies dilution gas to the source gas extraction path and controls the flow rate of the dilution gas flowing through the dilution gas supply path such that this flow rate reaches a second set flow rate, or a pressure control valve that is provided on the source gas extraction path;

a concentration control unit that controls the concentration of the source gas by altering the first set flow rate and the second set flow rate that are set respectively in the first mass flow controller and the second mass flow controller based on a deviation between a set concentration that has been previously set and the calculated concentration, and on various types of gains that have been set as control parameters, or that controls the concentration of the source gas by controlling at least an aperture of the pressure control valve based on a deviation between a set concentration, which has been set in advance, and the calculated concentration, and on set control parameters; and a source consumption quantity calculator that, based on the calculated concentration calculated by the concentration calculation unit and on a flow rate of the carrier gas, calculates a consumption quantity of the source which has been extracted to the source gas extraction path as source gas, wherein the various types of gains that have been set as control parameters are altered in accordance with the consumption quantity of the source that is calculated by the source consumption quantity calculator, or in accordance with the remaining quantity of the source inside the vaporization tank.

2. The concentration control apparatus according to claim 1, wherein the source consumption quantity calculator calculates the consumption quantity of the source based on the calculated concentration and on a total carrier flow rate, which is a sum of the flow rate of the carrier gas and a flow rate of the dilution gas.

3. The concentration control apparatus according to claim 2, wherein the source consumption quantity calculator comprises:

a source flow rate calculation unit that calculates the flow rate of the source gas at particular timings from the calculated concentration and the total carrier flow rate at the particular timings; and a consumption quantity calculation unit that calculates the consumption quantity of the source based on the flow rate of the source gas at the particular timings, and on a source gas supply time which is the length of time that the source gas is supplied to the source gas extraction path.

4. The concentration control apparatus according to claim 3, wherein the source flow rate calculation unit calculates the total carrier flow rate from the first set flow rate or the flow rate of the carrier gas measured by the first mass flow controller, and from the second set flow rate or the flow rate of the dilution gas measured by the second mass flow controller.

5. The concentration control apparatus according to claim 1, wherein the source consumption quantity calculator calculates the consumption quantity of the source based on the first set flow rate or the flow rate of the carrier gas measured by the first mass flow controller.

6. The concentration control apparatus according to claim 5, wherein the source consumption quantity calculator comprises:

a source flow rate calculation unit that calculates the flow rate of the source gas at particular timings from the calculated concentration and the flow rate of the carrier gas at the particular timings; and a consumption quantity calculation unit that calculates the consumption quantity of the source based on the flow rate of the source gas at the particular timings, and on a source gas supply time which is the length of time that the source gas is supplied to the source gas extraction path.

7. The concentration control apparatus according to claim 1, further comprising:

a control parameter storage unit that stores a plurality of control parameters corresponding to the consumption quantity of the source or to the remaining quantity of the source; and a control parameter setting unit that refers to the control parameter storage unit in accordance with the consumption quantity of the source calculated by the source consumption quantity calculator, or with the remaining quantity of the source, and sets corresponding control parameters in the concentration control unit.

8. A concentration control method that, in a vaporizer that is equipped with at least a vaporization tank containing a liquid or solid source, a carrier gas supply path that supplies a carrier gas to the vaporization tank, and a source gas extraction path along which flows a source gas which is created by vaporizing the source and is then extracted from the vaporization tank, is used to estimate a consumption quantity of the source comprising:

providing a first mass flow controller on the carrier gas supply path, the first mass flow controller controls the flow rate of the carrier gas flowing through the carrier gas supply path such that this flow rate reaches a first set flow rate;

providing a second mass flow controller on a dilution gas supply path that merges with the source gas extraction path and supplies dilution gas to the source gas extraction path, the second mass flow controller controls the flow rate of the dilution gas flowing through the dilution gas supply path such that this flow rate reaches a second set flow rate, or providing a pressure control valve on the source gas extraction path;

providing a concentration control unit that controls the concentration of the source gas by altering the first set flow rate and the second set flow rate that are set respectively in the first mass flow controller and the second mass flow controller based on a deviation between a set concentration that has been previously set and a calculated concentration, and on various types of gains that have been set as control parameters, or that controls the concentration of the source gas by controlling at least an aperture of the pressure control valve based on a deviation between a set concentration, which has been set in advance, and the calculated concentration, and on set control parameters;

calculating a concentration of the source gas based on output signals from a concentration monitor that is provided on the source gas extraction path;

calculating a consumption quantity of the source which has been extracted to the source gas extraction path as the source gas based on the calculated concentration and on a flow rate of the carrier gas; and altering the various types of gains that have been set as control parameters in accordance with the calculated consumption quantity of the source, or in accordance with the remaining quantity of the source inside the vaporization tank.

9. A non-transitory program recording medium on which is recorded a program for a concentration control apparatus that, in a vaporizer that is equipped with at least a vaporization tank containing a liquid or solid source, a carrier gas supply path that supplies a carrier gas to the vaporization tank, and a source gas extraction path along Which flows a source gas which is created by vaporizing the source and is then extracted from the vaporization tank, is equipped with a concentration monitor which is provided on the source gas extraction path and outputs output signals in accordance with a concentration of the source gas, and controls a concentration of the source gas, a first mass flow controller that is provided on the carrier gas supply path and controls the flow rate of the carrier gas flowing through the carrier gas supply path such that this flow rate reaches a first set flow rate, a second mass flow controller that is provided on a dilution gas supply path that merges with the source gas extraction path and supplies dilution gas to the source gas extraction path and controls the flow rate of the dilution gas flowing through the dilution gas supply path such that this flow rate reaches a second set flow rate, or a pressure control valve that is provided on the source gas extraction path, wherein the program causes a computer to perform functions of:

a concentration calculation unit that, based on the output signals from the concentration monitor, calculates the concentration of the source gas;

a source consumption quantity calculator that, based on the calculated concentration calculated by the concentration calculation unit and on a flow rate of the carrier gas, calculates a consumption quantity of the source Which has been extracted to the source gas extraction path as source gas; and a concentration control unit that controls the concentration of the source gas by altering the first set flow rate and the second set flow rate that are set respectively in the first mass flow controller and the second mass flow controller based on a deviation between a set concentration that has been previously set and the calculated concentration, and on various types of gains that have been set as control parameters, or that controls the concentration of the source gas by controlling at least an aperture of the pressure control valve based on a deviation between a set concentration, which has been set in advance, and the calculated concentration, and on set control parameters, wherein the various types of gains that have been set as control parameters are altered in accordance with the consumption quantity of the source that is calculated by the source consumption quantity calculator, or in accordance with the remaining quantity of the source inside the vaporization tank.

\* \* \* \* \*